United States Patent
Kim et al.

(10) Patent No.: US 7,307,269 B2
(45) Date of Patent: Dec. 11, 2007

(54) PHASE-CHANGE RAM CONTAINING AlN THERMAL DISSIPATION LAYER AND TiN ELECTRODE

(75) Inventors: Seong-Il Kim, Seoul (KR); Yong-Tae Kim, Seungnam (KR); Young-Hwan Kim, Seoul (KR); Chun-Keun Kim, Seoul (KR); Min-Soo Youm, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 85 days.

(21) Appl. No.: 11/270,711

(22) Filed: Nov. 8, 2005

(65) Prior Publication Data

US 2006/0133174 A1    Jun. 22, 2006

(30) Foreign Application Priority Data

Dec. 16, 2004   (KR) ...................... 10-2004-0107265

(51) Int. Cl.
*H01L 29/02*    (2006.01)
(52) U.S. Cl. .................. 257/2; 257/E23.051; 257/1; 257/3; 257/4; 257/5
(58) Field of Classification Search ............... 257/1–5, 257/E23.051; 438/900
See application file for complete search history.

(56) References Cited

U.S. PATENT DOCUMENTS 5,172,213 A * 12/1992 Zimmerman ............... 257/796
2004/0113136 A1 * 6/2004 Dennison ...................... 257/2

* cited by examiner

*Primary Examiner*—Jerome Jackson
*Assistant Examiner*—Jami M Valentine
(74) *Attorney, Agent, or Firm*—Darby & Darby PC (57) ABSTRACT

Provided is a phase-change RAM containing a substrate, a lower electrode, a phase-change material, an upper electrode and a thermal dissipation layer, wherein the thermal dissipation layer contains an aluminum-nitride thermal dissipation layer having a high heat conductivity, and the lower electrode contains a titanium-nitride electrode which generates a great amount of heat generated using a small amount of current and has a low heat conductivity, whereby heat generated between the phase-change material and the electrode is not transferred to the interior of a device but fast dissipated to the exterior thereof, so as to enable a high speed operation using low current and improve reliability of the device.

4 Claims, 6 Drawing Sheets

PHASE-CHANGE RAM CONTAINING AlN THERMAL DISSIPATION LAYER AND TiN ELECTRODE

BACKGROUND OF THE INVENTION

1. Field of the Invention

The present invention relates to a phase-change Random Access Memory (RAM) containing a substrate, a lower electrode, a phase-change material, an upper electrode and a thermal dissipation layer, and particularly, to a phase-change RAM enabling high speed operation with a low current and having improved reliability.

2. Background of the Related Art

Development of next generation memory technologies to replace memory devices such as DRAMs, SRAMs, FLASH memories or the like in the field of semiconductor memories is actively being pursued. According to this trend, much attention is being devoted to a phase-change type RAM that employs a change of resistance which has simple structure and superior properties as compared with other types of next generation memories. Depending on upcoming developments, the phase-change RAM can be expected to replace FLASH memories and may further replace DRAMs and SRAMs, and accordingly to ultimately replace even auxiliary memory units.

The phase-change RAM, which applies heat to a particular material to change its phase and uses the change of its resistance, is a next generation type memory semiconductor for storing data by determining the resistance change according to the phase-change of the material. This phase-change RAM can facilitate the ensuring of operational properties as a stable memory. Also, the phase-change RAM has a characteristic that is not sensitive to changes caused by external conditions. For application as an optical memory, data writing and deleting are performed by heating the particular material using a laser beam to thusly change its phase. For application as an electrical memory, data writing and deleting are performed by heat generated by supplying current. Research for the phase-change RAM using the phase-change material has progressed for several years, but a commercialized product has not yet been released, and merely prototype memories for testing purposes are being fabricated.

The phase-change RAM under development uses a silicon dioxide film ($SiO_2$) for dissipating heat that is generated from the phase-change material to the exterior of a device, as well as for providing electrical insulation between an upper electrode and a lower electrode. However, to use the $SiO_2$ layer as an insulating layer, it has been found that the heat generated in an interface between the phase-change material and the lower electrode is not adequately dissipated to the exterior via the $SiO_2$ layer positioned at an upper end of the lower electrode, but rather such heat is directly transferred to the interior of the device through an electrode material having a superior heat conductivity. Thus, when heat is not properly dissipated to the exterior but transferred to the interior of the device, undesirable heat accumulates within the device when set and reset operations are repeatedly performed, which may cause breakdown of the device. In addition, the $SiO_2$ layer does not quickly dissipate heat to thereby increase the temperature of the overall device, and accordingly it takes a long time to cool the phase-change material, leading to undesirable lengthening of the reset time. Furthermore, when the reset operation is executed at a portion of the phase-change material, the reset is changed again in a set manner, which may cause problems during high speed operation and degrades the reliability of the device.

On the other hand, to achieve low power consumption and high integration of the phase-change RAM, it is preferable to reduce the surface area of the phase-change material which contacts with an electrode to thus generate the desired phase-change. However, due to a limitation of photolithography, there is a limitation in reducing the contact area in order to reduce power consumption. Accordingly, the characteristics of the electrode material and the thermal dissipation layer need to be improved to thusly obtain optimal properties of the phase-change material as much as possible, so as to actually improve the overall characteristics of the device.

BRIEF DESCRIPTION OF THE INVENTION

Therefore, an object of the present invention is to provide a technology for improving characteristics of a device so as to obtain optimal properties of a phase-change material as much as possible by improving the characteristics of the electrode material and thermal dissipation layer of an existing phase-change RAM, whereby it is possible to solve the related art problems in achieving high speed operation and reliability of the device, which are caused by not quickly dissipating heat generated in the device to the exterior.

To achieve these and other advantages and in accordance with the purpose of the present invention, as embodied and broadly described herein, there is provided a phase-change RAM containing a substrate, a lower electrode, a phase-change material, an upper electrode and a thermal dissipation layer, wherein the thermal dissipation layer contains an AlN (aluminum nitride) thermal dissipation layer having a high heat conductivity, and the lower electrode contains a TiN (titanium nitride) electrode which has a low heat conductivity and generates a great amount of heat using a small amount of current. As a result, the phase-change RAM can operate at high speed using low current and its reliability can be improved by rapidly dissipating heat generated between the phase-change material and the electrode to the exterior without transferring the heat into the device.

Atypical phase-change RAM uses a method in which heat generation due to a flow of current passing through the phase-change material is used to change the phase-change material in a crystalline state to an amorphous state within a time range of about 10 to 50 nsec so as to store information. Accordingly, it is important to definitely characterize the distribution of the heat within the device. When the heat is concentrated on a particular part of the device, the heat may change the information stored in the device. Therefore, the contact portion between the phase-change material and the electrode in the device is the location where heat is generated. Also, after generating heat to perform the phase-change, the remaining heat must be quickly dissipated to the exterior. Such heat generating and heat dissipating can be achieved by a thermal electrode and a thermal dissipation layer.

By using a material having conductivity that is superior to that of silicon dioxide film typically used for providing electrical insulation between the upper electrode and the lower electrode and also for dissipating heat generated from the phase-change material to the exterior of the device, the amount of heat dissipated to the exterior is increased so as to advantageously enable fast cooling of the phase-change material and reducing a reset time thereof.

As aforementioned, the fast dissipating of the heat generated at the interface between the phase-change material and the electrode material to the exterior of the device is very important for ensuring of a high-speed operation of the device and establishing reliability thereof. Therefore, considering this, the phase-change RAM may be preferably fabricated using a material having a heat conductivity superior to that of the silicon dioxide film that was typically used in the related art.

On the other hand, using of a material having good heat conductivity as an insulating layer allows a fast operation speed of the device and reduction of an operational temperature of the entire device, but problems in ensuring a temperature required for the phase-change caused by redundantly dissipating the heat to the exterior may occur. In order to solve such problem, it is advantageous to use a material which generates greater heat with the same amount of current, but also having low heat conductivity.

The present invention employs a material capable of generating a phase-change with a minimum power consumption and improving a cooling rate by use of various combinations between electrode materials and thermal dissipation layers. Such material can be applied to the existing phase-change RAM, such that a highly integrated phase-change RAM device having an operational characteristic of low power using a reduced power required for the phase-change can be provided.

When applying materials used in a Complementary Metal-Oxide-Semiconductor (CMOS) process to the phase-change RAM, there has been no problem in the fabrication process. However, it was found that the heat generated at the interface between electrode materials and the phase-change material is not dissipated to the exterior via an insulating layer positioned at an upper end of the lower electrode, but transferred to the interior of the device through an electrode material. Accordingly, the electrode material that would be appropriate for use in the phase-change RAM should be able to generate high heat using a small amount of current and transfer of the generated heat should occur only to the phase-change material in contact with the heat because of its low heat conductivity, without transferring the heat to the interior of the device.

In the present invention, titanium nitride (TiN) may be used as the electrode material having such characteristics, although other materials may also be sufficient to achieve the results of the present invention. The TiN has about 1/10 to 1/100 of heat conductivity as compared with other materials such as Ti or W, which enables the reducing of the amount of heat to be transferred to the interior of the device through the electrode. In addition, in the present invention, aluminum nitride (AlN) may be used as the thermal dissipation layer for dissipating the heat generated at the interface between the phase-change material and the electrode to the exterior of the device, although other materials may also be sufficient to achieve the results of the present invention. Table 1 shows some properties related to mechanical, thermal, and electrical characteristics of the AlN.

TABLE 1

| | Measuring Unit | SI/Metric | (Imperial) |
|---|---|---|---|
| Mechanical Characteristic | | | |
| Density | gm/cc (lb/ft3) | 3.26 | (203.5) |
| Porosity | % (%) | 0 | (0) |
| Color | — | Gray | — |
| Bending Strength | MPa (lb/in2 × 103) | 320 | (46.4) |
| Elastic Modulus | GPa (lb/in2 × 106) | 330 | (47.8) |
| Shearing Elastic Modulus | GPa (lb/in2 × 106) | — | — |
| Bulk Modulus | GPa (lb/in2 × 106) | — | — |
| Poisson's Ratio | — | 0.24 | (0.24) |
| Compressive Strength | MPa (lb/in2 × 103) | 2100 | (304.5) |
| Longitude | Kg/mm2 | 1100 | — |
| Fracture Toughness (KIC) | MPa · m1/2 | 2.6 | — |
| Maximum Temperature (no load) | ° C. | — | — |
| Thermal Characteristic | | | |
| Heat Conductivity | W/m · ° C. (BTU · in/ ft2 · hr · ° C.) | 140-180 | (970-1250) |
| Thermal Expansion Coefficient | 10-6/° C. (10-6/° C.) | 4.5 | (2.5) |
| Turpitude | J/Kg · ° C. (Btu/lb · ° C.) | 740 | (0.18) |
| Electrical Characteristic | | | |
| Dielectric Strength | ac-kv/mm (volts/mil) | 17 | (425) |
| Dielectric Constant | @ 1 MHz | 9 | (9) |
| Radiation Coefficient | @ 1 MHz | 0.0003 | (0.0003) |
| Loss Tangent | @ 1 MHz | — | — |
| Volume Resistance | ohmjcm | >1014 | — |

As shown in Table 1, the AlN has the thermal conductivity as superior as that of metal, and thermal expansivity similar to that of silicon, so that a rift may not be generated (or minimal) even when repeating numerous heating and cooling operations. Accordingly, the AlN can be deposited using an atomic layer deposition method so as to facilitate the controlling of its thickness and enable uniform deposition on a surface of the device. Therefore, the AlN can be an optimal material for the thermal dissipation layer when fabricating the phase-change RAM.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

The present invention is directed to a phase-change RAM that can have a lower electrode 2, a phase-change material 3, an upper electrode 5 and a thermal dissipation layer 8, wherein the thermal dissipation layer 8 contains an AlN thermal dissipation layer having relatively high heat conductivity, and the lower electrode 2 contains a TiN electrode which has a relatively low heat conductivity and generates a relatively large amount of heat using a relatively small amount of current. According to this, the phase-change RAM allows fast dissipating of heat generated between the phase-change material and an electrode to the exterior without transferring the generated heat into a device, thereby enabling its high speed operation with a low current and improving its reliability.

The present invention also relates to a phase-change RAM, as a perpendicular electrode type phase-change RAM, which can have a TiN lower electrode, a phase-change material and an upper electrode in a layered sequence, and has a structure in which the TiN lower electrode is etched to have a relatively narrow contact area with the phase-change material, and the AlN thermal dissipation layer can be formed around (over or surrounding) the phase-change material and the upper electrode. In detail, the phase-change RAM can have an exemplary structure shown in FIG. 1d. In the memory device, the contact area in which the phase-change occurs is determined depending on a size of a thermal electrode, and the size of the thermal electrode is influenced by a limitation of a photolithography.

Figure 1A:
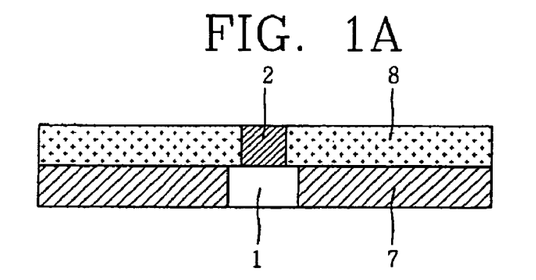
FIGS. 1a to 1d are sectional views illustrating an exemplary structure obtained by applying AlN thermal dissipation layer and TiN electrode to a perpendicular electrode type phase-change RAM structure according to its fabricating processes.
Figure 1B:
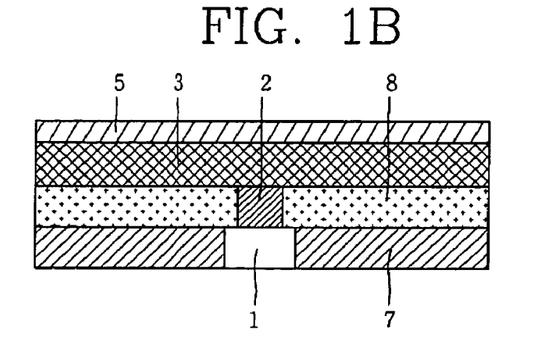
Figure 1C:
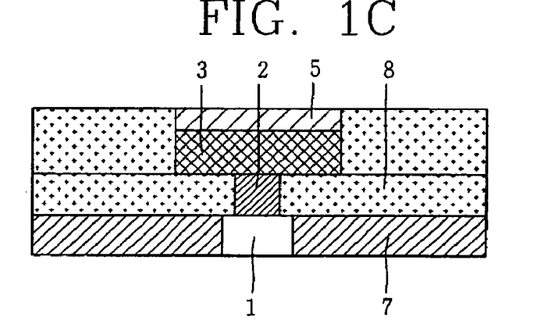
Figure 1D:
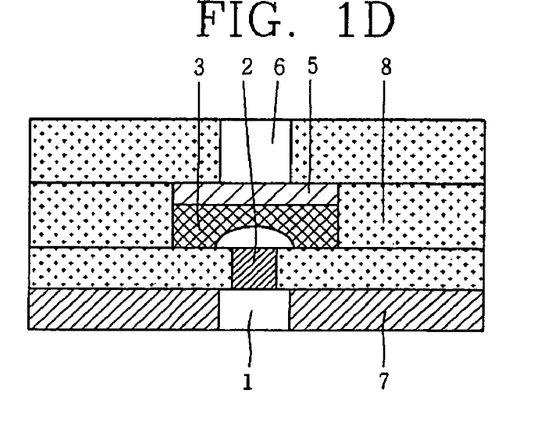

FIGS. 1a to 1d illustrate sectional views of an exemplary structure of a perpendicular electrode type phase-change RAM to which a TiN thermal electrode and an AlN thermal dissipation layer of the present invention are applied, according to its fabricating processes. First, as illustrated in FIG. 1a, TiN 2 as a lower electrode can be deposited on a lower electrode contact portion 1 interposed between inter insulating layers 7. Thereafter, as illustrated in FIG. 1b, the phase-change material 3 and the upper electrode 5 can be deposited on the TiN lower electrode 2 in sequence. As illustrated in FIGS. 1a to 1c, the AlN thermal dissipation layer 8 can be deposited in a manner to have a structure that surrounds the phase-change material 3 according to an atomic layer deposition method. An upper electrode contact portion 6 is then deposited on the upper electrode 5. As illustrated in FIG. 1d, while the device operates, only a portion 4 in contact with the lower electrode 2, which corresponds to a thermal electrode of the entire phase-change material 3, is phase-changed to thusly perform an operation as a memory. At this time, the contact area 4 of the portion where the phase-change occurs must be relatively small so as to be sufficiently heated using a small amount of current. As a result, in order to lower a driving voltage and reduce power consumption, it is preferable to reduce the contact area between the thermal electrode and the phase-change material as much as possible.

Furthermore, the present invention relates to a phase-change RAM, in particular, an edge contact type phase-change RAM, having a structure in which a TiN lower electrode is formed and thereafter a trench is formed at only one side of the lower electrode so as to expose a lateral section of the lower electrode. Then, the phase-change material can be deposited on the surface of the lower electrode so that the one lateral surface of the lower electrode has a contact portion with the phase-change material and an AlN thermal dissipation layer is formed around the TiN lower electrode and the phase-change material. In more detail, such phase-change RAM may have an exemplary structure as shown in FIG. 2d. The contact area between the lower electrode and the phase-change material of the device is determined by a deposited thickness of the lower electrode and a deposited width of the lower electrode according to the photolithography technique that is used. In general, regarding to the deposited thickness, the contact area can be reduced down to 10 nm or less so as to enable the implementing of a finer (more precise) contact area. Regarding to the deposited width, it is difficult to reduce the contact area down to 70 nm or less due to limitations of currently available photolithography techniques.

Figure 2A:
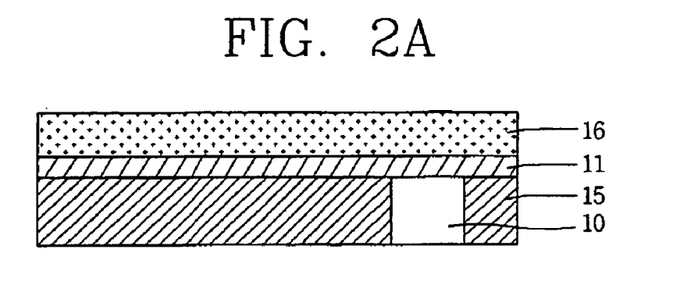
FIGS. 2a to 2d are sectional views illustrating an exemplary structure obtained by applying AlN thermal dissipation layer and TiN electrode to an edge contact type phase-change RAM structure according to its fabricating processes.
Figure 2B:
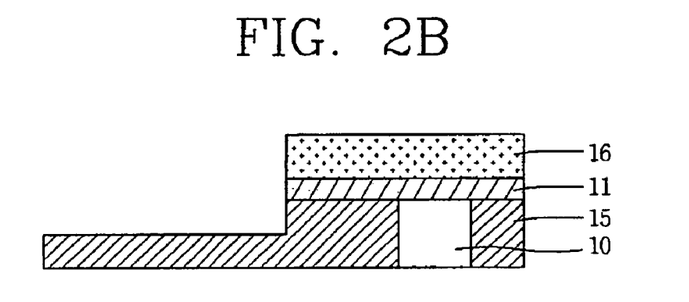
Figure 2C:
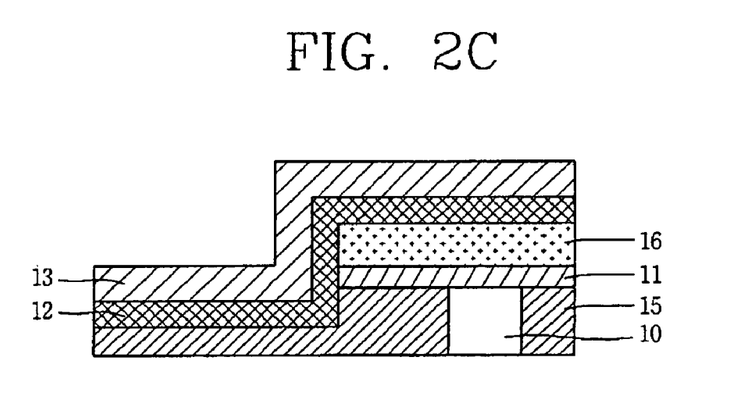
Figure 2D:
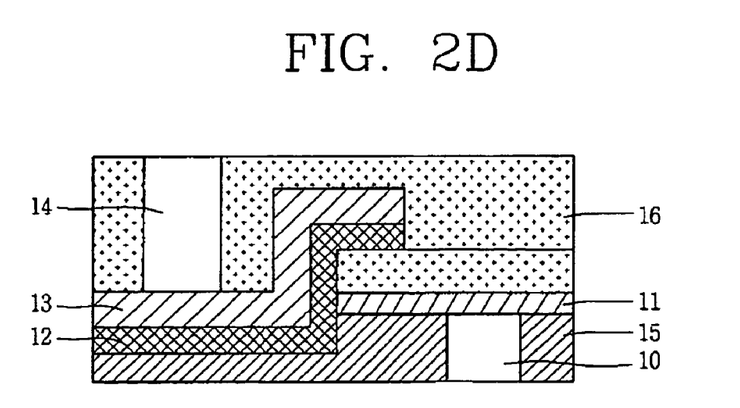

FIGS. 2a to 2d illustrate an edge contact type phase-change RAM that can reduce a contact area between a thermal electrode and a phase-change material according to the present invention. Sectional views of an exemplary structure of a memory to which TiN electrode and AlN thermal dissipation layer are applied according to its fabricating processes are shown. As illustrated in FIG. 2a, a TiN lower electrode 11 can be deposited on an inter insulating layer 15 and a lower electrode contact portion 10 to thereafter form an electrode using photolithography. Thereafter, an atomic layer deposition method can be used to deposit an AlN layer 16 on the TiN lower electrode 11, wherein the AlN layer 16 is not only a thermal dissipation layer for dissipating heat generated between the phase-change material and the lower electrode to the exterior, but also is an insulator for preventing an electrical contact among the lower electrode contact portion, the lower electrode, an upper electrode contact portion, an upper electrode and the phase-change material. Afterwards, as illustrated in FIG. 2b, a trench can be formed so as to allow a section of the lower electrode to be exposed. As illustrated in FIG. 2c, the phase-change material 12 and the upper electrode 13 are sequentially deposited to thusly form a portion where the lateral section of the lower electrode is contact with the phase-change material 12. Then, parts of the phase-change material 12 and the upper electrode 13 are etched. Accordingly, as illustrated in FIG. 2d, the AlN layer 16 is deposited on the previously deposited AlN layer and parts of the phase-change material 12 and on the upper electrode 13 remaining without being etched, and an upper electrode contact portion 14 with the upper electrode 13 can be formed by performing the trench process again.

The present invention also relates to a phase-change RAM fabricated by using a spacer patterning technology, in which the TiN lower electrode and AlN thermal dissipation layer are sequentially formed and thereafter, a part of the AlN thermal dissipation layer is etched, and the phase-change material is deposited on the etched portion of the AlN thermal dissipation layer on the TiN lower electrode to be thereafter perpendicularly etched, so that the phase-change material remains with a relatively small area at a lateral surface of the AlN thermal dissipation layer on the TiN lower electrode and the AlN thermal dissipation layer is formed again on the phase-change material. In more detail, the phase-change RAM may have an exemplary structure as shown in FIG. 3d. The contact area between the phase-change material and the lower electrode in the phase-change RAM device can be adjusted according to the perpendicular etching of the phase-change material.

Figure 3A:
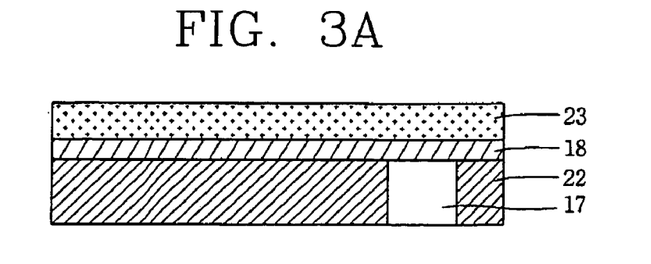
FIGS. 3a to 3d are sectional views illustrating an exemplary structure obtained by applying AlN thermal dissipation layer and TiN electrode to a perpendicular electrode type phase-change RAM structure using a spacer patterning technology according to its fabricating processes.
Figure 3B:
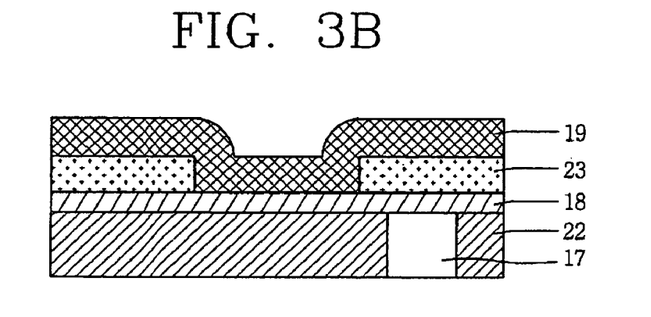
Figure 3C:
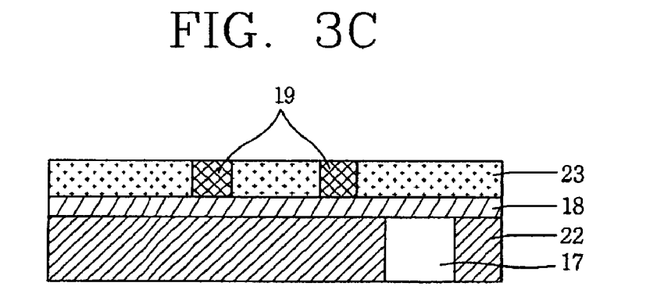
Figure 3D:
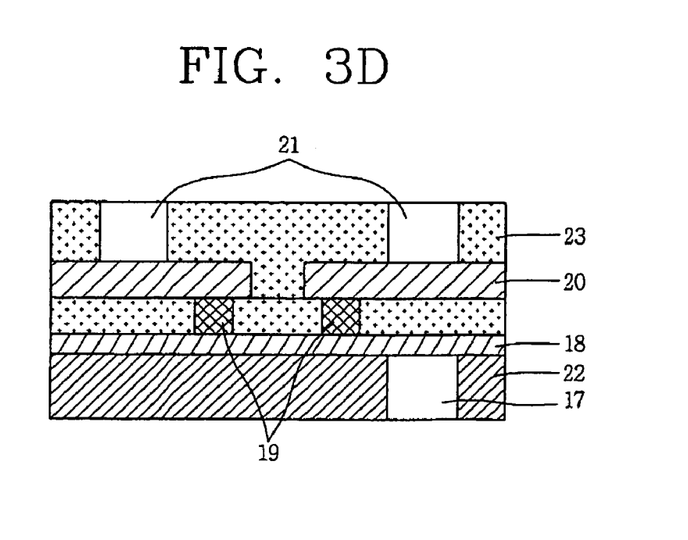

FIGS. 3a to 3d are sectional views illustrating an exemplary structure of a phase-change RAM fabricated using a spacer patterning technology according to the present invention, to which a TiN electrode and AlN thermal dissipation layer are applied, according to its fabricating processes. As illustrated in FIG. 3a, a lower electrode contact portion 17 can be formed between silicon dioxide layers 22 (inter insulating layers). A TiN lower electrode 18 is deposited and an AlN thermal dissipation layer 23 is then deposited using an atomic layer deposition method. Thereafter, as illustrated in FIG. 3b, a part of the AlN portion 23 is etched to thereafter deposit the phase-change material 19 thereon. When the phase-change material is perpendicularly etched, the phase-change material remains only at a lateral surface of the AlN portion 23 due to a difference of the deposited thickness. Afterwards, as illustrated in FIG. 3c, the AlN material is re-deposited and planarized using a CMP process to deposit an upper electrode 20 and the AlN portion 23 on the planarized AlN material and an upper electrode contact portion 21 is formed, so as to obtain the phase-change RAM device having fine (precise) contact points between the lower electrode and the phase-change material 19, as shown in FIG. 3d.

The present invention is also directed to a phase-change RAM including an exemplary structure in which a TiN lower electrode and AlN thermal dissipation layer are sequentially formed to be partially etched with respect to each other, by which lateral sections (side edges) of both are exposed. Thereafter, a phase-change material is deposited and perpendicularly etched, whereby the phase-change material is positioned at a contact portion with the lateral surfaces of both the TiN lower electrode and the AlN thermal dissipation layer. In more detail, the phase-change RAM may have a structure shown in FIG. 4d. The phase-change RAM device is similar to the memory device shown in FIG. 3d. However, the contact area can be adjusted according to the deposited thickness of the lower electrode in this phase-change RAM device so as to enable implementing of a finer (more precise) contact area.

Figure 4A:
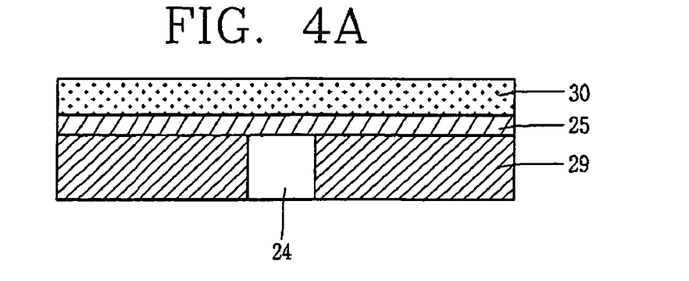
FIGS. 4a to 4d are sectional views illustrating an exemplary structure obtained by applying AlN thermal dissipation layer and TiN electrode to a horizontal electrode type phase-change RAM structure using a spacer patterning technology according to its fabricating processes.
Figure 4B:
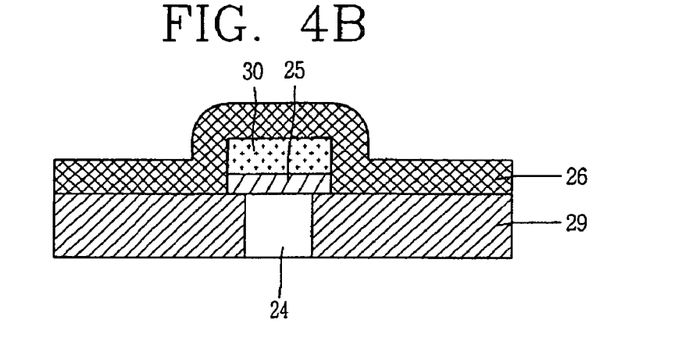
Figure 4C:
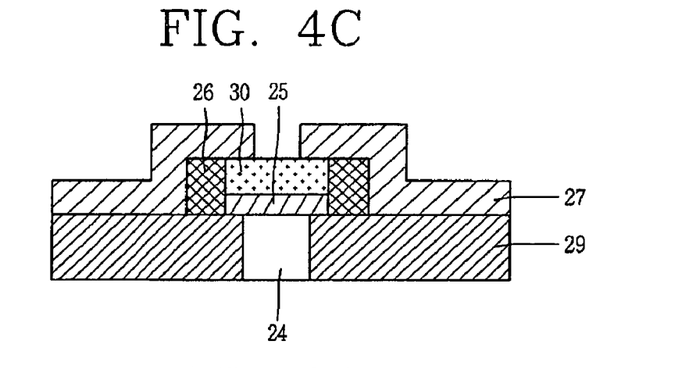
Figure 4D:
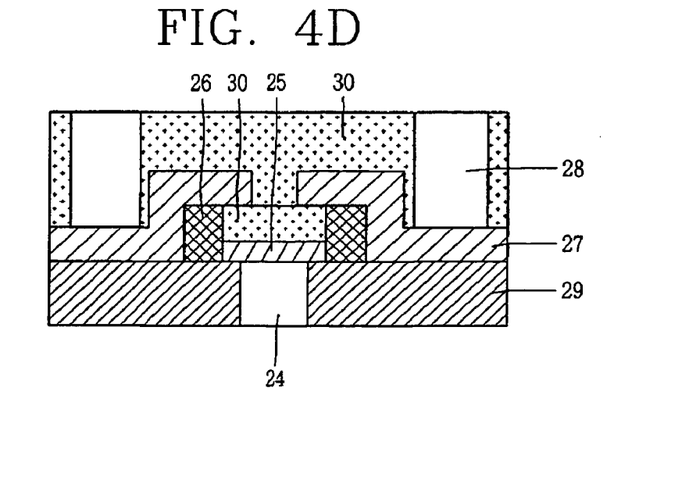

FIGS. 4a to 4d illustrate sectional views of an exemplary device to which a TiN electrode and AlN thermal dissipation layer are applied depending on its fabricating processes according to the present invention. As illustrated in FIG. 4a, a lower electrode contact portion 24 can be formed between silicon dioxide films 29 (inter insulating layers), and a TiN lower electrode 25 and an AlN thermal dissipation layer 30 are deposited. Afterwards, as illustrated in FIG. 4b, the TiN layer 25 and the AlN layer 30 are partially etched, and the phase-change material 26 is uniformly deposited thereon. Thereafter, the phase-change material is perpendicularly etched, to thereby cause the phase-change material to remain only at the lateral surface (i.e., side edges) of the electrode as shown in FIG. 4c. An upper electrode 27 is deposited and the AlN layer 30 is then re-deposited on the upper electrode 27. The AlN layer 30 is partially etched to form an upper electrode contact portion 28, thereby obtaining a perpendicular electrode type phase-change RAM using the spacer patterning technology as shown in FIG. 4d.

In the present invention, preferably, the AlN thermal dissipation layer may be deposited using an atomic layer deposition method that shows a large step coverage.

Figure 5:
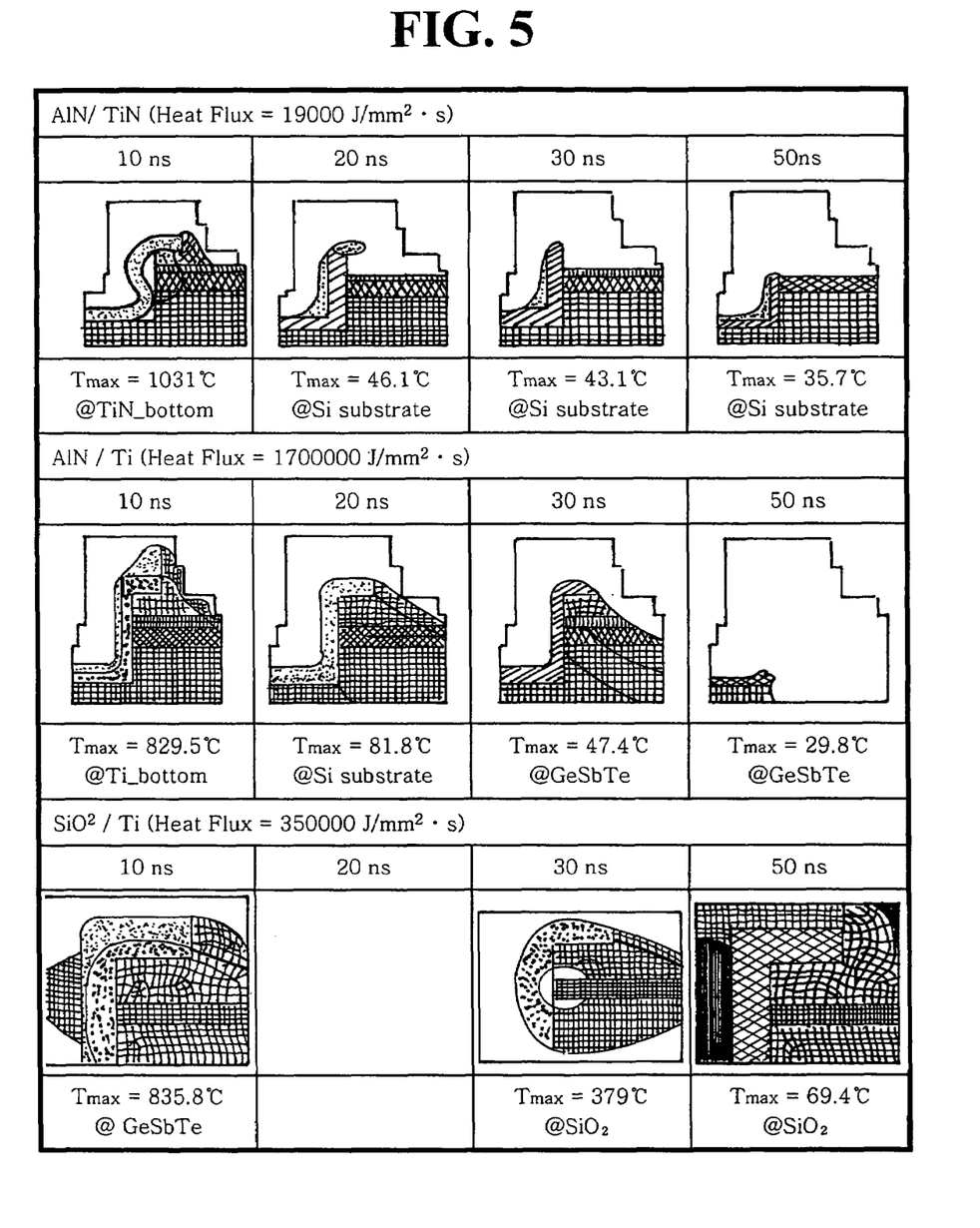
FIG. 5 illustrates heat transfer characteristics according to a combination between an electrode material and a thermal dissipation layer, namely, compares the heat transfer characteristics of a memory device to which AlN thermal dissipation layer/TiN electrode, AlN thermal dissipation layer/Ti electrode, and $SiO_2$ thermal dissipation layer/Ti electrode are applied, respectively.

FIG. 5 shows a comparison of heat transfer characteristics according to a combination between an electrode material and a phase-change material in order to show that the combination between TiN electrode and AlN thermal dissipation layer provided according to the present invention is preferred in a manner of a heat transfer within a device. For obtaining a temperature at which the phase-change material is changed from a crystalline state into an amorphous state, a heat flux is provided so as to allow a temperature of the electrode to be more than 700° C. For even the same Ti electrode, an increase of the amount of heat dissipated to the exterior requires the heating of the electrode by a higher temperature according to the type of thermal dissipation layer, so that the amount of the heat flux being provided is changed. In FIG. 5, the combinations between electrodes and thermal dissipation layers may be shown as follows; 1. AlN thermal dissipation layer/TiN electrode, 2. AlN thermal dissipation layer/Ti electrode, and 3. $SiO_2$ thermal dissipation layer/Ti electrode. The provided heat flux may be shown as follows; 1. AlN thermal dissipation layer/TiN electrode: 19000 $J/mm^2 \cdot s$, 2. AlN thermal dissipation layer/Ti electrode: 1700000 $J/mm^2 \cdot s$, and 3. $SiO_2$ thermal dissipation layer/Ti electrode: 350000 $J/mm^2 \cdot s$. FIG. 5 shows heat transfer characteristics of the three combinations according to time variation in processes of heating for 10 nsec and cooling for 10 to 50 nsec.

Referring to FIG. 5, the heat generated for 10 nsec after initially heating will be described. That is, in the combination of the AlN thermal dissipation layer/Ti electrode (1), the greatest heat (1031° C.) has been generated with respect to the lowest heat flux (19000 $J/mm^2 \cdot s$). In the combination of the AlN thermal dissipation layer/Ti electrode (2), on the other hand, the amount of heat generated in the Ti electrode is less than that generated in the TiN electrode. Also, in this combination, even though the heat is generated, the greatest heat flux (1700000 $J/mm^2 \cdot s$) is required due to the fast heat dissipation to the exterior through the AlN material having superior heat conductivity. In addition, in the heat distribution of the AlN thermal dissipation layer/TiN electrode (1), a relatively small amount of heat is transferred to the interior of the device because of the relatively low heat conductivity of the TiN, while the heat is dissipated to the exterior of the device via the AlN material having a high heat conductivity. Accordingly, it was found that the heat is concentrated on the contact portion between the electrode and the phase-change material. On the other hand, for the $SiO_2$ thermal dissipation layer/Ti electrode (3), it can be seen that the heat generated at the contact portion is transferred to the interior of the device via the electrode and also, the heat slowly spreads via the $SiO_2$ layer.

Afterwards, considering the distribution of heat generated for 20 up to 50 nsec, for the AlN thermal dissipation layer/TiN electrode (1), the electrode is rapidly cooled via the AlN material having superior heat conductivity, and accordingly, a portion of the highest temperature would be the Si substrate, which means that the cooling operation of the phase-change material is rapidly progressed. On the other hand, for the AlN thermal dissipation layer/Ti electrode (2), it can be seen that a large amount of heat is spread to the interior of the device, and such heat remains at a lower portion of the lower electrode for a long time. Thus, when set-reset operations are repeatedly performed when the heat remains at the lower portion of the lower electrode, even a portion at the contact portion where the phase-change material is not located, may also undergo phase-changes, which may disadvantageously influence the reliability of the device.

Figure 6A:
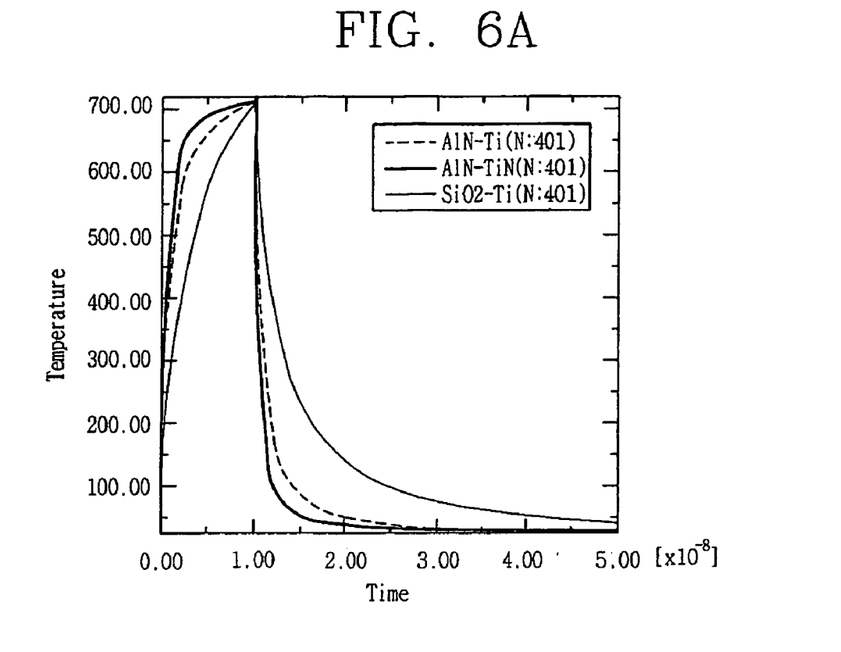
FIG. 6a is a graph showing a distribution of temperature obtained by heating for 10 nsec and cooling for 40 nsec of a certain portion of a phase-change material at a contact portion with the AlN thermal dissipation layer/TiN electrode, AlN thermal dissipation layer/Ti electrode, and $SiO_2$ thermal dissipation layer/Ti electrode.
Figure 6B:
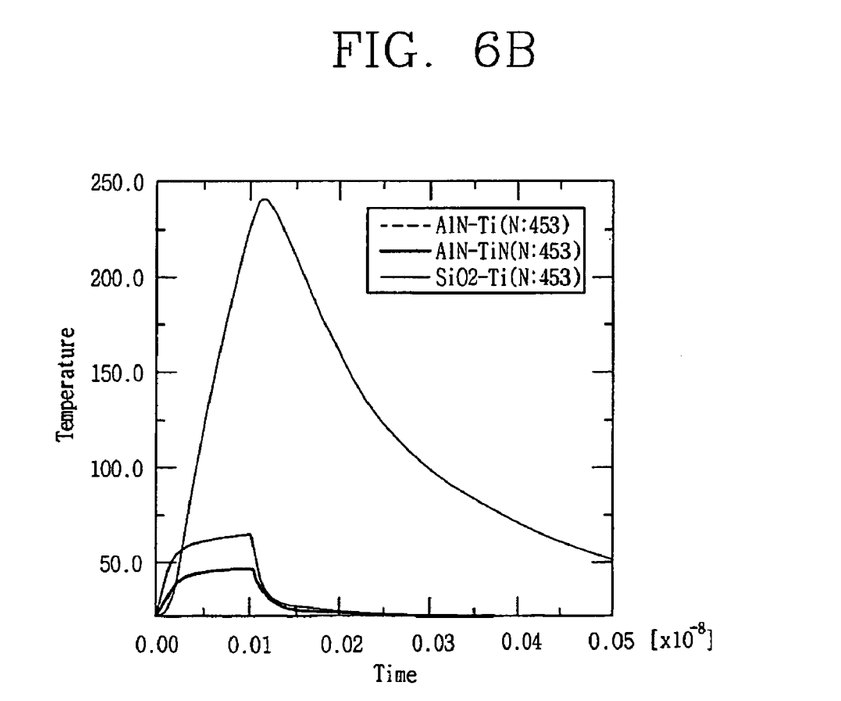
FIG. 6b is a graph showing a distribution of temperature according to time at a thermal dissipation layer on a lower electrode regarding to combinations of AlN thermal dissipation layer/TiN electrode, AlN thermal dissipation layer/Ti electrode, and $SiO_2$ thermal dissipation layer/Ti electrode.

FIG. 6a is a graph illustrating a temperature distribution of a portion, at which a phase-change material is positioned, according to time at a node where a lower electrode is contact with the phase-change material in the phase-change RAM device having such structure shown in FIG. 2d. As illustrated in FIG. 6a, the phase-change material in the AlN thermal dissipation layer/TiN electrode memory device changes most quickly at a temperature of about 650° C., at which the phase-change material is changed from a crystalline state into an amorphous state. Also, it can be seen that the time required for cooling the phase-change material down to 200° C. is only about 2 nsec. FIG. 6b is a graph illustrating a temperature distribution according to time at a thermal dissipation layer on a lower electrode. For the AlN material having a relatively high heat conductivity, when a greater amount of heat is dissipated to the exterior, the temperature of the thermal dissipation layer is increased more slightly and the thermal dissipation layer is rapidly cooled. Conversely, for the $SiO_2$ having relatively low heat conductivity, it can be seen that the temperature is increased up to 250° C., at which the amorphous phase-change material is changed to crystalline state. Thus, for the $SiO_2$, when the temperature is increased up to changing the amorphous material into the crystalline state, the phase-change material is not rapidly cooled at a time of reset operation, and thus the phase-change operation is not uniformly changed into crystalline state, but partially remains as crystalline material. As a result, resistance changes may occur, which may cause a problems in reading the stored information.

The present invention provides a phase-change memory, comprising: a metal alloy stack formed of a lower electrode made of titanium nitride and a thermal dissipation layer made of aluminum nitride over the lower electrode; and a phase-change material formed at opposing side end portions of the metal alloy stack, whereby the metal alloy stack allows appropriate heat energy to be generated in the phase-change material and allows the generated heat to quickly dissipate thereafter, to achieve appropriate phase changes between a crystalline state and an amorphous state of the phase-change material for writing and reading of data in memory.

Also, the present invention provides a phase-change memory, comprising: a titanium nitride lower electrode; an aluminum nitride thermal dissipation layer having a first portion covering the titanium nitride layer and a second portion thereabove; and a phase-change material formed at side edges of the titanium nitride lower electrode and the first portion of the aluminum nitride thermal dissipation layer, whereby the titanium nitride and the aluminum nitride allow the phase-change material to heat up and cool down in a rapid manner when reading and writing data in memory. Additionally, the present invention further comprises: a substrate having a lower electrode contact portion, whereby the titanium nitride lower electrode covers the lower electrode contact portion; and an upper electrode covering the substrate, partially covering the first portion of the aluminum nitride thermal dissipation layer, and totally covering the phase-change material, wherein the second portion of the aluminum nitride thermal dissipation layer covers the upper electrode, and the second portion has contact holes therethrough to expose portions of the upper electrode.

As described so far, in order to maximize the characteristics of the phase-change material in a development process of the phase-change RAM, it is important to consider and select the appropriate electrode material for providing heat and the proper thermal dissipation layer for performing heat dissipation. As shown in the present invention, use of the AlN thermal dissipation layer and the TiN electrode allows the generating of heat required for a phase-change with a relatively small amount of current and quick heat dissipation is achieved, while performing a reset operation so as to change the phase-change material into a completely amorphous material. In addition, when the heat is dissipated to the exterior via the thermal dissipation layer, an operational time of the device can be advantageously increased. In the present invention, the phase-change RAM can be fabricated using the AlN thermal dissipation layer and the TiN electrode, and thus a memory device enabling high speed operation using a relatively low current and improved reliability can be provided.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A phase-change Random Access Memory (RAM) comprising:
    a substrate,
    a lower electrode containing TiN (titanium nitride) deposited on the substrate;
    a thermal dissipation layer containing AlN (aluminum nitride) deposited over the lower electrode, wherein at least one lateral surface of the lower electrode and the thermal dissipation layer is etched,
    a phase-change material formed to contact with the etched lateral surface of the at least one lower electrode and thermal dissipation layer; and
    an upper electrode in contact with the phase-change material.

2. The phase-change RAM of claim 1, wherein the thermal dissipation layer containing AlN (aluminum nitride) is formed around the lower electrode, the phase-change material arid the upper electrode.

3. A phase-change memory, comprising:
    a substrate;
    a TiN (titanium nitride) lower electrode deposited on the substrate;

a first AlN (aluminum nitride) thermal dissipation layer covering the TiN (titanium nitride) lower electrode, wherein at least one lateral surface of the lower electrode and the thermal dissipation layer is etched; and a phase-change material formed to contact with the at least one etched lateral surface of the TiN (titanium nitride) lower electrode and the AlN (aluminum nitride) thermal dissipation layer, whereby the TiN (titanium nitride) and the AlN (aluminum nitride) allow the phase-change material to heat up and cool down in a rapid manner when reading and writing data in memory.

4. The memory of claim 3, further comprising:

an upper electrode partially covering the AlN (aluminum nitride) thermal dissipation layer, and totally covering the phase-change material; a second AlN (aluminum nitride) thermal dissipation layer that covers the upper electrode and has contact holes therethrough to expose portions of the upper electrode; and a lower electrode contact portion covered by the TiN (titanium nitride) lower electrode.

* * * * *